(12) United States Patent
Wei et al.

(10) Patent No.: US 7,846,557 B2
(45) Date of Patent: Dec. 7, 2010

(54) LIGHT-EMITTING DIODE OF POLYMER NANOCOMPOSITE WITH QUANTUM DOTS

(75) Inventors: Kung-Hwa Wei, Hsinchu (TW); Chia-Hung Chou, Yonghe (TW)

(73) Assignee: National Chiao Tung University, Hsinchu (TW)

( * ) Notice: Subject to any disclaimer, the term of this patent is extended or adjusted under 35 U.S.C. 154(b) by 989 days.

(21) Appl. No.: 11/377,176

(22) Filed: Mar. 17, 2006

(65) Prior Publication Data
US 2007/0154734 A1    Jul. 5, 2007

(30) Foreign Application Priority Data
Jan. 3, 2006    (TW) .............................. 95100137 A

(51) Int. Cl.
*H01L 51/54*    (2006.01)
*C09K 11/06*    (2006.01)

(52) U.S. Cl. .................... 428/690; 248/917; 313/504; 313/506; 427/66; 252/301.16; 252/301.21; 257/40; 257/102; 257/103; 257/E51.032

(58) Field of Classification Search ................ 428/690, 428/917; 313/504, 506; 252/301.16–301.35; 257/40
See application file for complete search history.

(56) References Cited

U.S. PATENT DOCUMENTS 5,442,254 A * 8/1995 Jaskie ..................... 313/485

2003/0222572 A1 * 12/2003 Su et al. ..................... 313/503

OTHER PUBLICATIONS

Chou et al. "Synthesis and characterization of dendronized polyfluorenes" Macromolecules 2002, vol. 35, pp. 9673-9677.*
Synthesis and Characterization of Highly Luminescent Asymmetric Poly (p-phenylene vinylene) Derivatives for Light-Emitting Diodes, Jin et al., 2002 American Chemical Society, pp. 643-650.
Efficient Near-Infrared Polymer Nanocrystal Light-Emitting Diodes, Tessler et al., Feb. 22, 2002, vol. 295, Science Magazine, pp. 1506-1508.
Fast interfacial charge separation in chemically hybridized CdS-PVK nanocomposites studied by photoluminescence and photoconductivity measurements, Cheng et al., Jan. 19, 2001, Chemical Physics Letters 333 (2001), pp. 375-380.
Laser emission from solutions and films containing semiconducting polymer and titanium dioxide nanocrystals, Hide et al., Jul. 5, 1996, Chemical Physics Letters 256 (1996), pp. 424-430.
Hybrid Nanorod-Polymer Solar Cells, Huynh et al., Mar. 29, 2002, vol. 295, Science Magazine, pp. 2425-2427.
Electronics Surfactant Designed to Mediate Electron Transfer Between CdSe Nanocrystals and Organic Semiconductors, Milliron et al., Adv. Mater. 2003, 15, No. 1, Jan. 3, pp. 58-61.

* cited by examiner

*Primary Examiner*—D. Lawrence Tarazano
*Assistant Examiner*—Michael Wilson
(74) *Attorney, Agent, or Firm*—Muncy, Geissler, Olds & Lowe, PLLC

(57) ABSTRACT

The present invention provides a light-emitting diode made of a polymer nanocomposite doped with quantum dots to improve luminescence efficiency and to increase stability and electrical characteristics.

20 Claims, 7 Drawing Sheets

| Parameters<br>LEDs | Extinction coefficient ($M^{-1} cm^{-1}$) | Optical density in solid state | membrane thickness (nm) | chromophore concentration ($mol/cm^3$) | quantum efficiency |
|---|---|---|---|---|---|
| PF-G1 | $4.48 \times 10^4$ | 0.326 | 95 | 0.771 | 0.22 |
| 3 wt% S-CdS/PF-G1 | $4.61 \times 10^4$ | 0.301 | 106 | 0.620 | 0.39 |
| 4 wt% S-CdS/PF-G1 | $4.91 \times 10^4$ | 0.293 | 88 | 0.680 | 0.46 |
| 8 wt% S-CdS/PF-G1 | $4.92 \times 10^4$ | 0.290 | 90 | 0.655 | 0.44 |
| PF-G2 | $7.70 \times 10^4$ | 0.192 | 76 | 0.328 | 0.55 |
| 3 wt% S-CdS/PF-G2 | $7.62 \times 10^4$ | 0.203 | 84 | 0.317 | 0.78 |
| 4 wt% S-CdS/PF-G2 | $7.51 \times 10^4$ | 0.226 | 81 | 0.372 | 0.99 |

FIG. 3

LIGHT-EMITTING DIODE OF POLYMER NANOCOMPOSITE WITH QUANTUM DOTS

FIELD OF THE INVENTION

The present invention relates to a light-emitting diode (LED); more particularly, relates to fabricating the LED using a polymer nanocomposite, which is a dendritic copolyfluorene doped with quantum dots of surface-modified CdS, to increase electroluminescence (EL) efficiency and photoluminescence (PL) efficiency to be a luminescence material for a monitor.

DESCRIPTION OF THE RELATED ARTS

The fabricating of an inorganic LED now requires a fabricating environment of high vacuum and high temperature. And, a polymer LED has characteristics of easy fabrication, size-enlargement and capability of being twisted, which is quite potential. But the PL efficiency of the polymer LED reaches only 25%, which makes the LED banding of the organic material and the inorganic material catch the eye of the public. Although a phosphorescence polymer LED was developed recently, it requires a heavy metal with unstable resources.

In Journal of Applied Physics, Volume 83, 1998, it is revealed that a layer of inorganic semiconductor CdSe and a layer of organic mixture of trioctyl phosphine and trioctyl phosphine oxide (TOP/TOPO) can be covered with a layer of protection of ZnS, where light emitting polymer (LEP) and quantum dots forms components of layers (AL/inorganic nanoparticles layer (CdSe)/organic hole transport layer (HTL)/metal oxide (indium tin oxide)). By measuring its EL, most EL (600 nm, nanometer) is generated from the inorganic CdSe under high voltage with a very weak contribution (500~550 nm) from the organic HTL of polyphenylene vinylene (PPV). The performance ((P)v.s.(I) slope) is basically affected by the thickness of the quantum dot layer. And lifetime test reveals promising stability with a time of operating over 50 to 100 hours. External quantum efficiency is also as high as 0.1%.

In Applied Physics Letters, Volume 66, 1995, it is revealed that, with layers of various components as Al/CdSe/polyvinylcarbazole (PVK)/polybutadiene (PBD), by using different quantum dot sizes under room temperature, the EL and PL are tunable from ~530 to ~650 nm. Under low voltage of 77000, only the quantum dot produces EL; yet, under high voltage, both the quantum dot and the PVK produce EL; and, after the film is cooled down, EL increases.

In Applied Physics Letters, Volume 66, 1995, it is revealed that, with a component made of PbS and conjugated polymer (such as poly(2-methoxy-5-(ethyl-hexyloxy)-1,4-phenylene vinylene) (MEHPPV) and poly(2-(6-cyano-68-methylheptyloxy)-1,4-phenylene) (CNPPV)), ELs between 1000 and 1600 nm are obtained according to various sizes of nanoparticles. Besides, a comparison is obtained by using capping ligands of different lengths.

Although the above prior arts fabricate LEDs, they are each made with various components under a complex procedure. Hence, the prior arts do not fulfill users' requests on actual use.

SUMMARY OF THE INVENTION

The main purpose of the present invention is to provide a polymer nanocomposite doped with quantum dots to obtain high EL and PL efficiencies, where a polymer LED for fabricated to increase in EL efficiency and PL efficiency and to control quantum dot size for obtaining an adjusted luminant wavelength, so that the efficiency, the heat-resistance and the lifetime of the polymer LED is improved.

To achieve the above purpose, the present invention is a LED of polymer nanocomposite with quantum dots, where the LED is made of a polymer nanocomposite; the polymer nanocomposite is a PF-GX of dendritic copolyfluorene doped with quantum dots of surface-modified CdS, where the X of PF-GX is 0, 1 or 2; the chemical structure of the polymer nanocomposite is as follows:

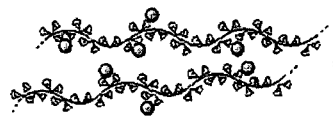

where the

is a quantum dot of the surface-modified CdS and the

is a side chain of the dendritic copolyfluorene. Accordingly, a novel LED with quantum dots of polymer nanocomposite is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is a view showing steps for obtaining a polymer nanocomposite according to a preferred embodiment of the present invention;

FIG. 3 is a view showing characteristics of various polymer nanocomposites according to the preferred embodiment of the present invention, regarding optical density in solid state, PL efficiency and quantum efficiency;

DESCRIPTION OF THE PREFERRED EMBODIMENTS

The following description of the preferred embodiment is provided to understand the features and the structures of the present invention.

The present invention is a light-emitting diode (LED) with quantum dots of polymer nanocomposite, where the LED is made of a polymer nanocomposite of PF-GX of a dendritic copolyfluorene doped with quantum dots of surface-modified cadmium sulfide (CdS); the X of PF-GX is a number of 0, 1 or 2; the polymer nanocomposite comprises a chemical structural of

the

is a quantum dot of the surface-modified CdS; and the

is a side chain of the dendritic copolyfluorene. Therein, when X is 0 for PF-G0, the side chain has a structure of —$CH_3$; when X is 1 for PF-G1, The side chain has a structure of

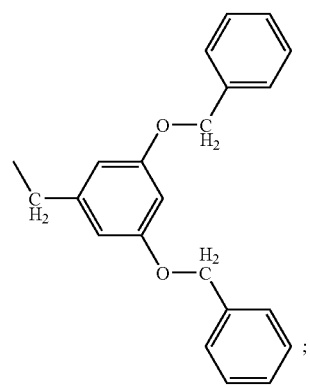
(II)

And, when X is 2 for PF-G2, the side chain has a structure of

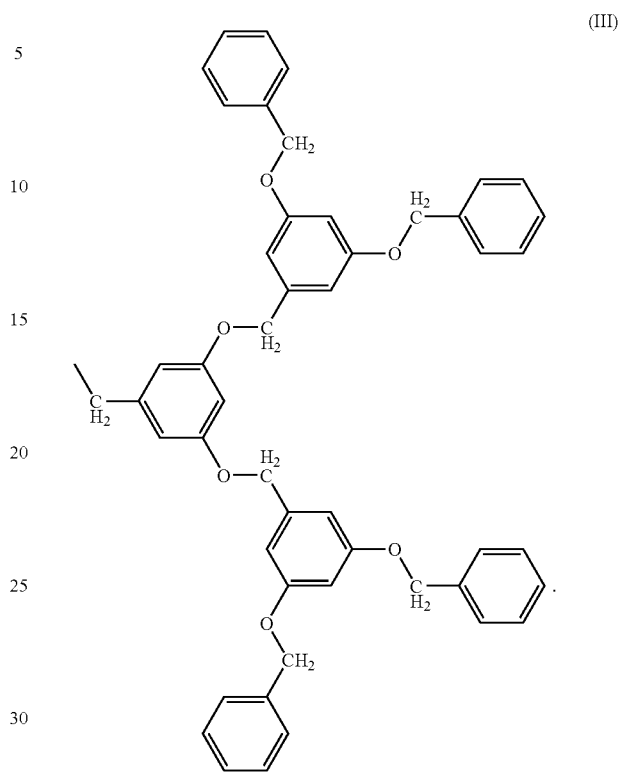
(III)

Figure 1:
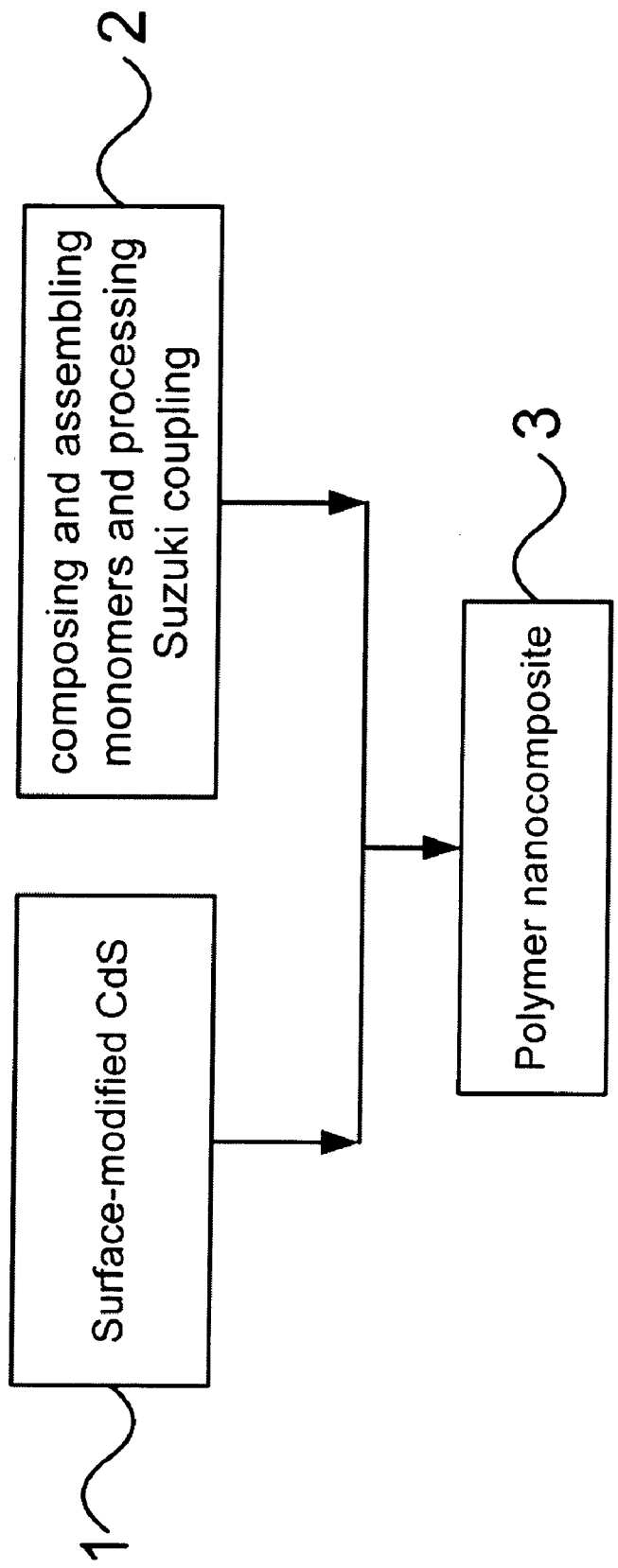
Figure 2A:
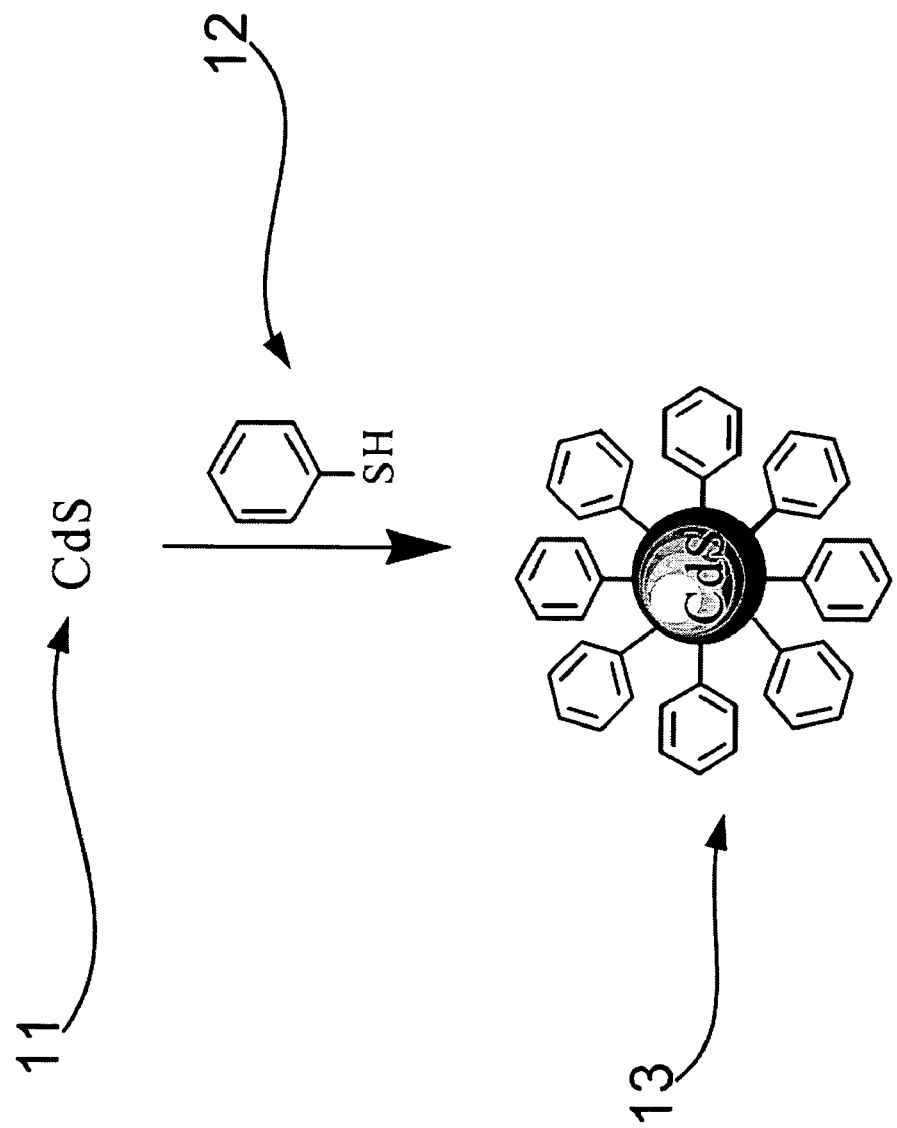
FIG. 2A is a view showing a chemical reaction in step (a) for obtaining the polymer nanocomposite according to a preferred embodiment of the present invention.
Figure 2B:
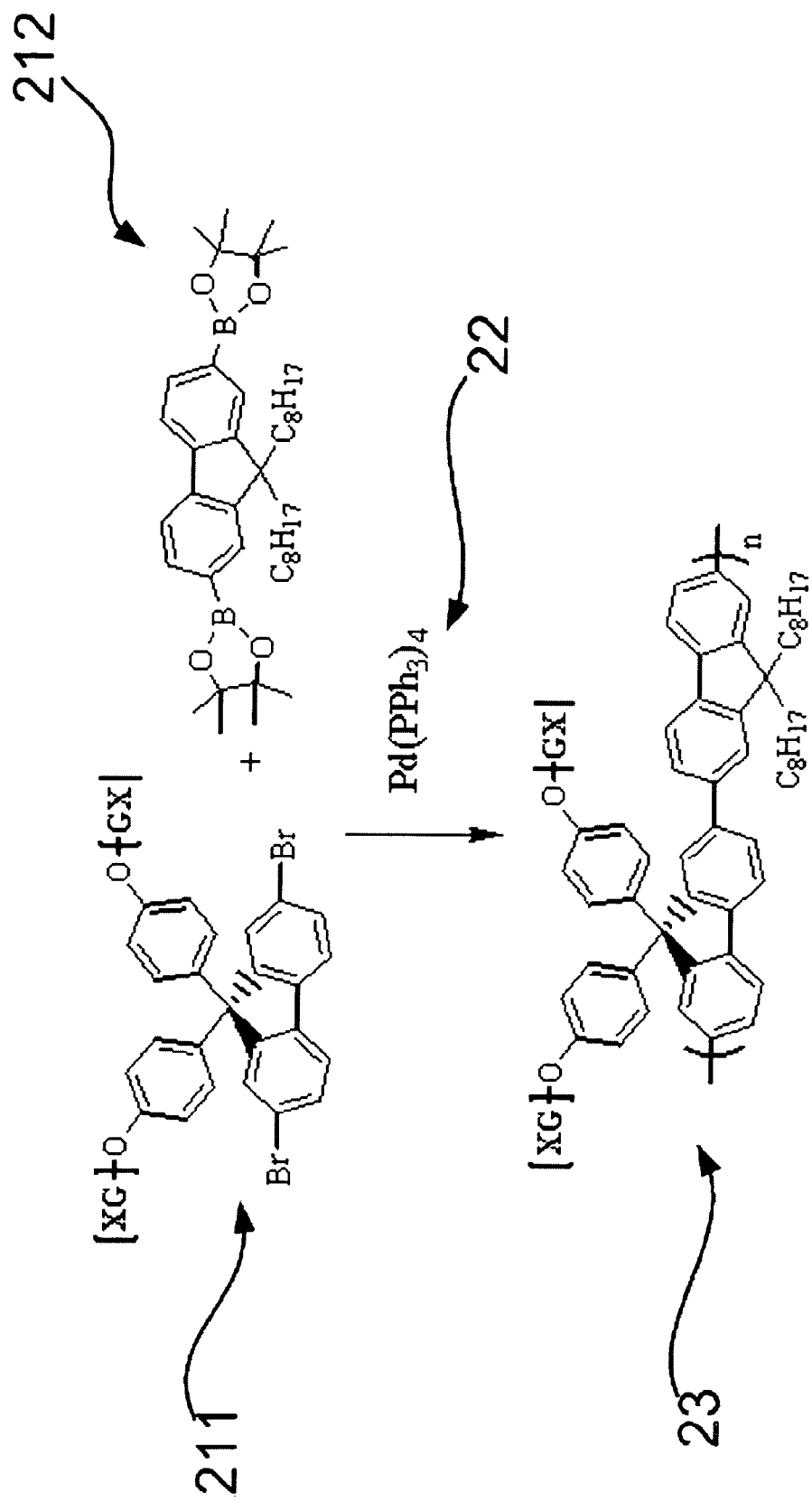
FIG. 2B is a view showing a chemical reaction in step (b) for obtaining the polymer nanocomposite according to a preferred embodiment of the present invention.

Please refer to FIG. 1 through FIG. 2B, which are a view showing steps for obtaining a polymer nanocomposite 3 and views showing chemical reactions in step (a) 1 and step (b) 2 for obtaining the polymer nanocomposite 3, according to a preferred embodiment of the present invention. As shown in the figures, the present invention is a LED with quantum dots of polymer nanocomposite 3, which has the following steps for obtaining the polymer nanocomposite 3:

Step (a) 1: Modifying surface of CdS 11 (quantum dot) through a thiophenol surfactant 12 to obtain a surface-modified CdS 13 (as shown in FIG. 2A);

Step (b) 2: Composing more than a monomer of dendritic structure 211, 212 to be assembled with a monomer of diboron compound 212 through a Suzuki coupling to obtain a dendritic copolyfluorene 23 (as shown in FIG. 2B); and Step (c) 3: Processing a banding of the product of step (a) 1 of the surface-modified CdS 13 and the product of step (b) 2 of the dendritic copolyfluorene 23 by a π-π interaction through a physical doping to obtain a product for a thermal treatment.

Through the above steps, a final product of a stable polymer nanocomposite 3 is obtained.

The polymer LED according to the present invention is made of a polymer nanocomposite, where the surface-modified CdS 13 and the dendritic copolyfluorene 23 are banded to obtain high photoluminescence (PL) efficiency and the quantum dot size of the surface-modified CdS 13 can be modified to enhance PL efficiency, heat resistance and lifetime.

Please refer to FIG. 3, which is a view showing characteristics of various polymer nanocomposites according to the preferred embodiment of the present invention, regarding optical density in solid state, PL efficiency and quantum efficiency. As shown in the figure, PF-GX of dendritic copolyfluorene according to the present invention is examined to obtain parameters of extinction coefficient ($\epsilon^a$) 51, optical density in solid state ($O.D.^b$) 52, membrane thickness ($L^c$) 53, concentration of chromophore ($M^d$) 54 and quantum efficiency ($\eta^e$) 55. When X of PF-GX is 1, the following PF-G1s are examined, including a single-layered dendritic copolyfluorene having no quantum dot (of surface-modified CdS) 41, a single-layered dendritic copolyfluorene having 3 wt % concentration of quantum dots 42, a single-layered dendritic copolyfluorene having 4 wt % concentration of quantum dots 43, and a single-layered dendritic copolyfluorene having 8 wt % concentration of quantum dots 44. When X of PF-GX is 2, the following PF-G2s are examined, including a double single-layered dendritic copolyfluorene having no quantum dot 45, a double single-layered dendritic copolyfluorene having 3 wt % concentration of quantum dots 46, and a double single-layered dendritic copolyfluorene having 4 wt % concentration of quantum dots 47. As a conclusion, no matter for a polymer light-emitting material of a single-layered dendritic copolyfluorene 41 or a double single-layered dendritic copolyfluorene 45, PL efficiency is improved by doping with quantum dots.

Figure 4:
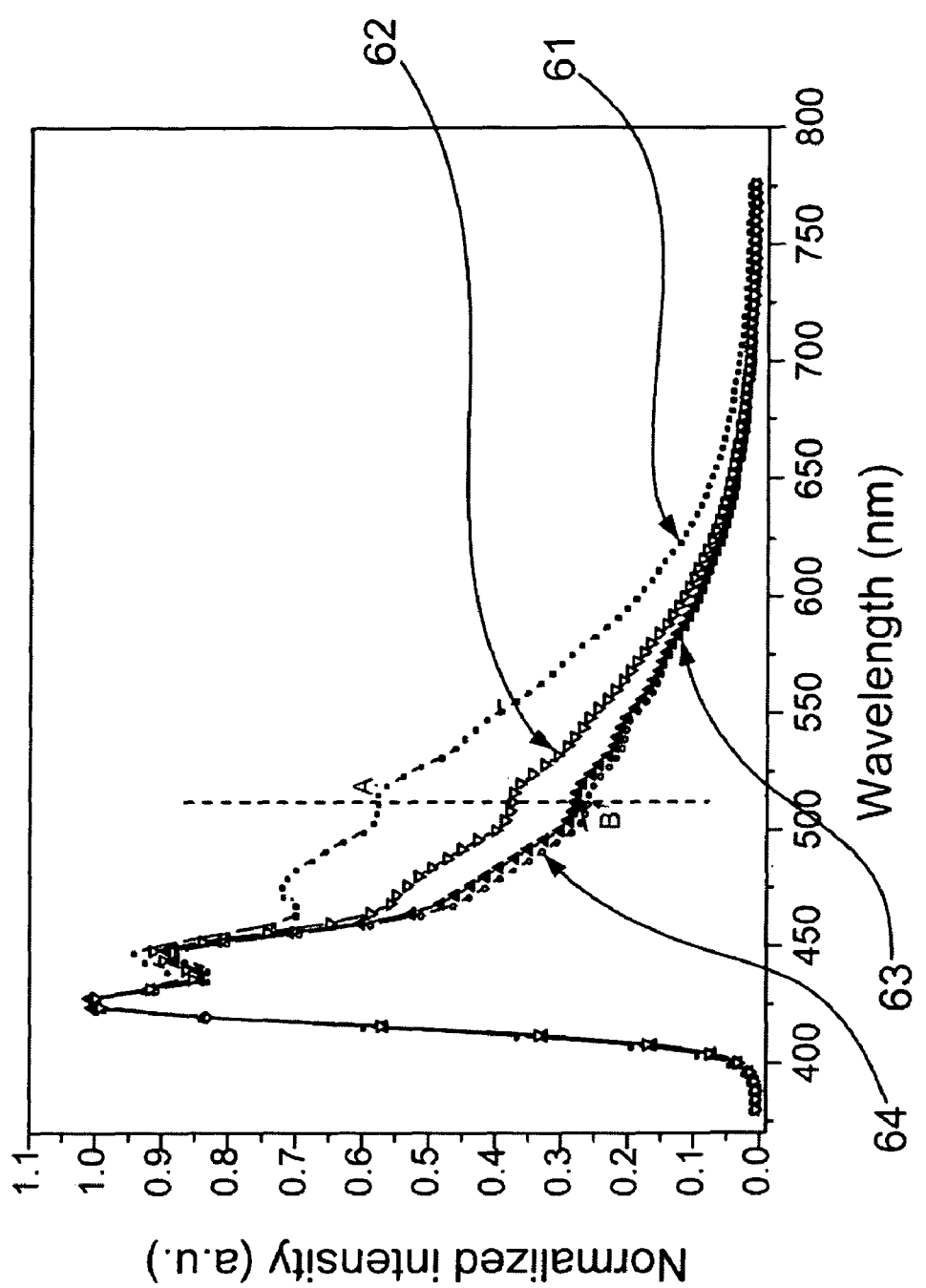
FIG. 4 is a view showing EL spectrum curves of LEDs of the various polymer nanocomposites according to the preferred embodiment of the present invention.

Please refer to FIG. 4, which is a view showing electroluminescence (EL) spectrum curves of LEDs of the various polymer nanocomposites according to the preferred embodiment of the present invention. As shown in the figure, a first 61, a second 62, a third 63 and a fourth 64 spectrum curves are included. The first spectrum curve 61 is a spectrum curve obtained from an EL of PF-G0 of a single-layered dendritic copolyfluorene having no quantum dot (of surface-modified CdS). As is shown, the strongest EL has a wavelength between 426 and 465 nm (nanometer), which appeared as a blue-green light. Furthermore, the second spectrum curve 62 is a spectrum curve obtained by an EL of PF-G1 of a single-layered dendritic copolyfluorene having 3 wt % concentration of quantum dot; the third spectrum curve 63 is a spectrum curve obtained from an EL of PF-G1 of a single-layered dendritic copolyfluorene having 4 wt % concentration of quantum dot; and the fourth spectrum curve 64 is a spectrum curve obtained from an EL of PF-G1 of a single-layered dendritic copolyfluorene having 8 wt % concentration of quantum dot. From the first 61, the second 62, the third 63 and the fourth 64 spectrum curves, it is shown that, by doping with certain densities of quantum dots in the PF-G1s, their full width half maximum (FWHM) are dropped from a point A of FWHM in the first spectrum curve 61 to a point B of FWHM in the fourth spectrum curve 64 which is a clear deduction; and, therefore, the occurrence of excimers is restrained and the light color is purer than that of the PF-G1 having no quantum dot.

Figure 5A:
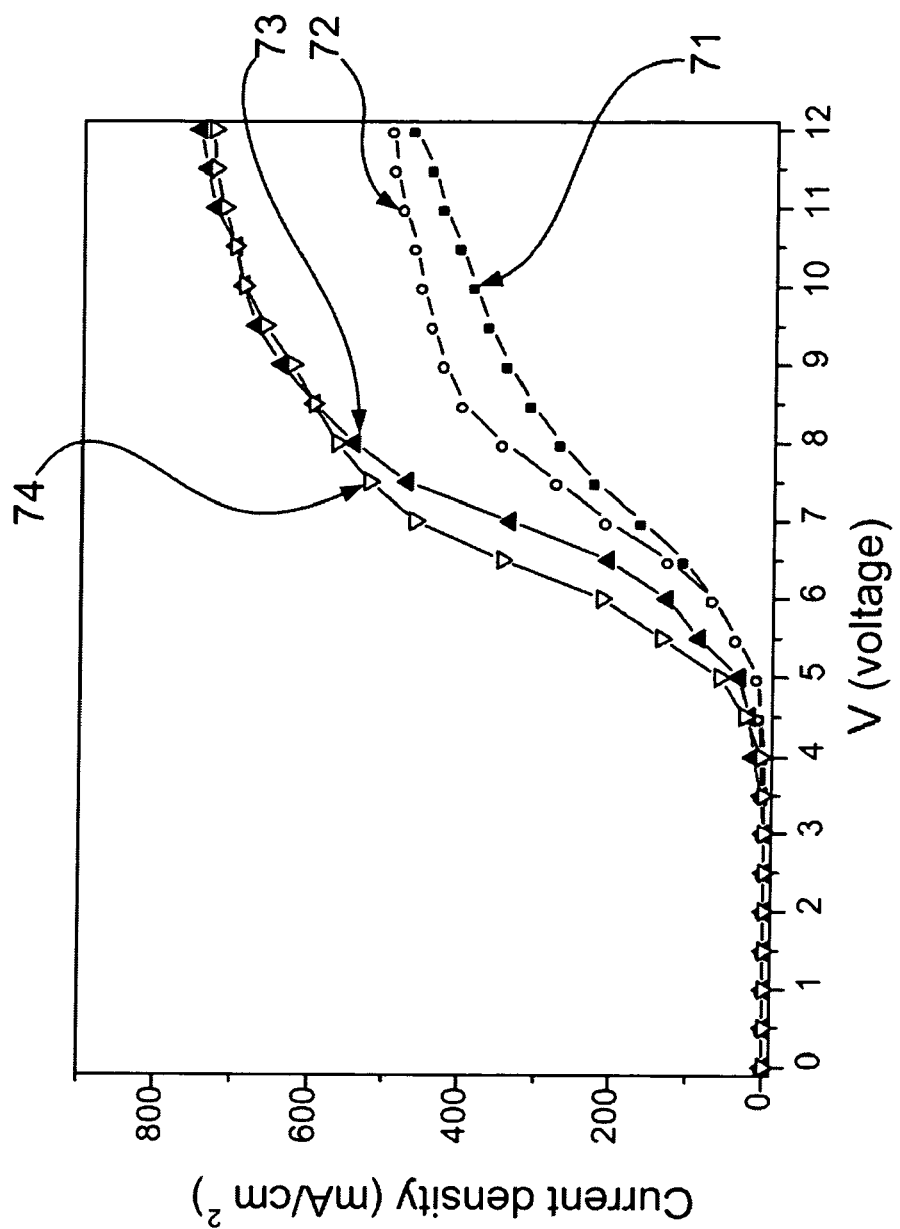
FIG. 5A is a view showing relationships between current density and voltage for the LEDs of the various polymer nanocomposites according to the preferred embodiment of the present invention.
Figure 5B:
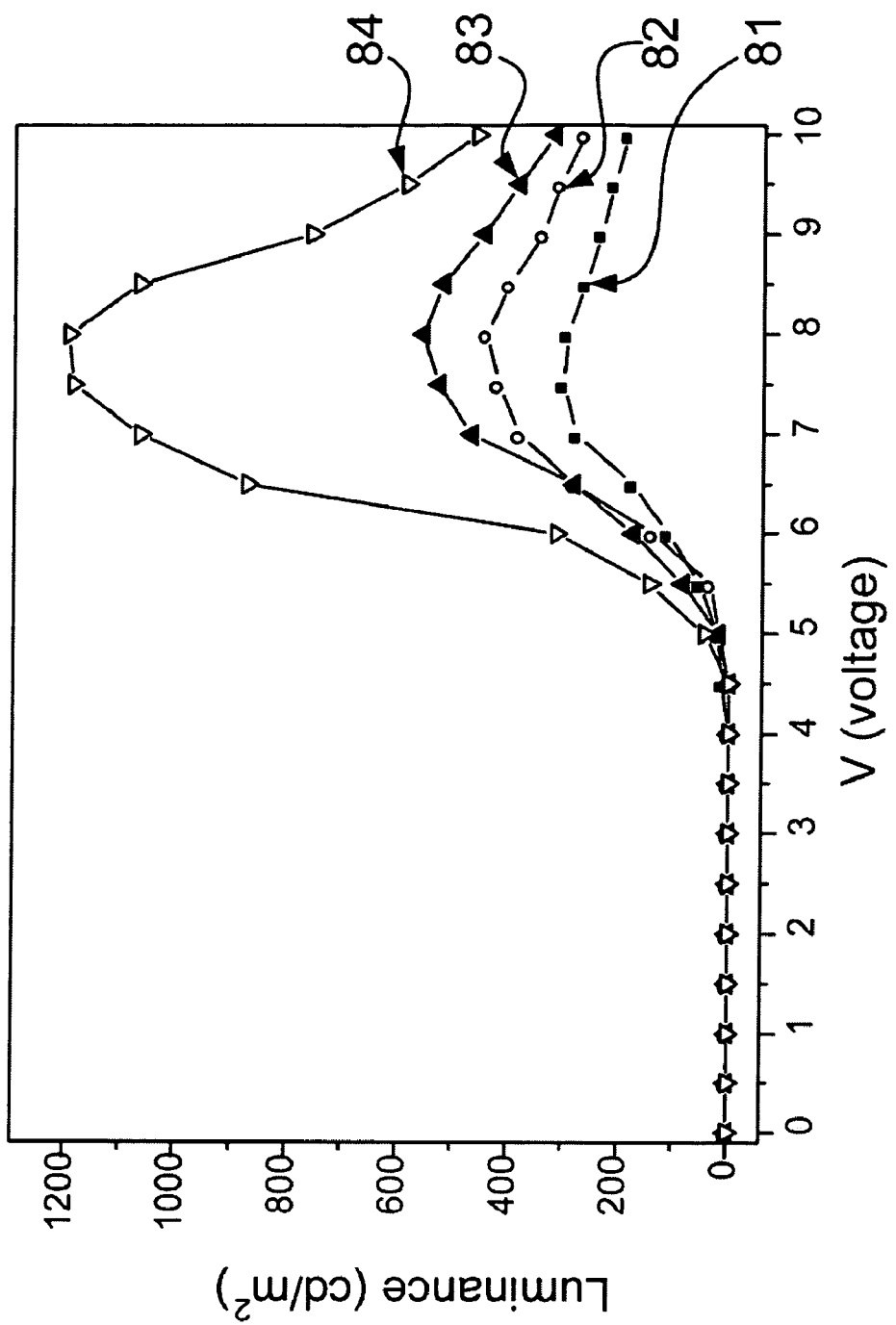
FIG. 5B is a view showing relationships between for the LEDs of the various polymer nanocomposites according to the preferred embodiment of the present invention.

Please refer to FIG. 5A and FIG. 5B, which are views showing relationships between current density and voltage and relationships between luminance and voltage for the LEDs of the various polymer nanocomposites according to the preferred embodiment of the present invention. As shown in the figures, the curves shown in FIG. 5A shows a first 71, a second 72, a third 73 and a fourth 74 relationships between current density and voltage; and, the curves shown in FIG. 5B shows a first 81, a second 82, a third 83 and a fourth 84 relationships between luminance and voltage. The curve showing the first relationship between current density and voltage 71 and the curve showing the first relationship between luminance and voltage 81 are obtained from an EL of a single-layered dendritic copolyfluorene having no quantum dot (of surface-modified CdS), showing changes to current density and luminance following changes in voltage. The curve showing the second relationship between current density and voltage 72 and the curve showing the second relationship between luminance and voltage 82 are obtained from an EL of PF-G0 having 3 wt % concentration of quantum dot, showing changes to current density and luminance following changes in voltage. The curve showing the third relationship between current density and voltage 73 and the curve showing the third relationship between luminance and voltage 83 are obtained from an EL of PF-G1 having 4 wt % concentration of quantum dot, showing changes to current density and luminance following changes in voltage. And, the fourth relationship between current density and voltage 74 and the fourth relationship between luminance and voltage 84 are obtained from an EL of PF-G2 having 8 wt % concentration of quantum dot, showing changes to current density and luminance following changes in voltage. From the above curves, it is known that, by doping quantum dots into single-layered dendritic copolyfluorene, the current carried by the LED made of the PX-GX is increased; and, the greatest luminance for the PX-GX having no quantum dot is 298 cd/m² and the greatest luminance for the PX-GX having 8 wt % concentration of quantum dot is 1196 cd/m², which is four times greater.

To sum up, the present invention is a LED with quantum dots of polymer nanocomposite, where the polymer nanocomposite for making the LED increases in EL efficiency and PL efficiency; and the LED thus made is increased in stability and electrical characteristics.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A light-emitting diode comprising:
(A) a polymeric nanocomposite of a fluorene copolymer comprising a plurality of side-chain moieties wherein each side-chain moiety (GX) is either bound directly or bound via an ether linkage to the fluorene copolymer and independently selected from the group consisting of:

—CH₃ (I)

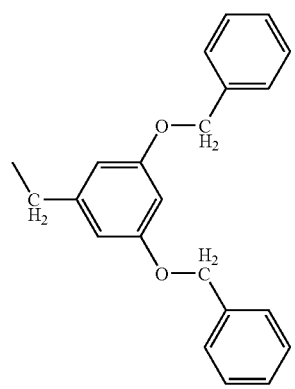

and

-continued

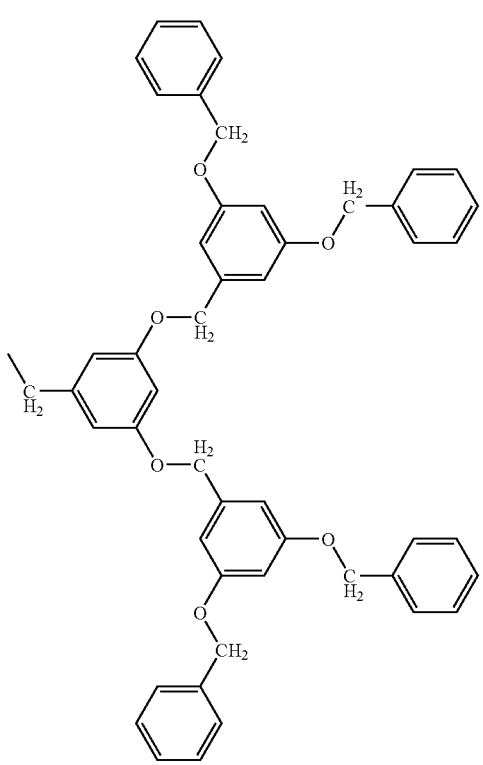

said polymeric nanocomposite of a copolyfluorene being doped with
(B) quantum dots of a surface-modified cadmium sulfide, wherein the quantum dots are non-luminescent.

2. The light-emitting diode of claim 1 wherein the side-chain moieties are of structure (I).

3. The light-emitting diode of claim 1 wherein the side-chain moieties are of structure (II).

4. The light-emitting diode of claim 1 wherein the side-chain moieties are of structure (III).

5. The light-emitting diode of claim 1 wherein the cadmium sulfide surface is modified by means of a thiophenol surfactant.

6. The light-emitting diode of claim 5 wherein the side-chain moieties are of structure (I).

7. The light-emitting diode of claim 5 wherein the side-chain moieties are of structure (II).

8. The light-emitting diode of claim 5 wherein the side-chain moieties are of structure (III).

9. The light-emitting diode of claim 1 wherein the fluorene copolymer is of the structure:

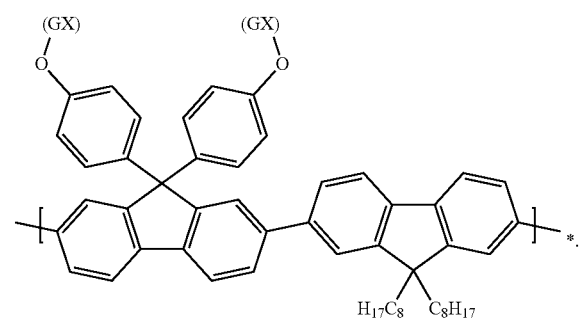

10. The light-emitting diode of claim 9 wherein the cadmium sulfide surface is modified by means of a thiophenol surfactant.

11. The light-emitting diode of claim 10 wherein the side-chain moieties are of structure (I).

12. The light-emitting diode of claim 10 wherein the side-chain moieties are of structure (II).

13. The light-emitting diode of claim 10 wherein the side-chain moieties are of structure (III).

14. The light-emitting diode of claim 9 wherein the side-chain moieties are of structure (I).

15. The light-emitting diode of claim 9 wherein the side-chain moieties are of structure (II).

16. The light-emitting diode of claim 9 wherein the side-chain moieties are of structure (III).

17. The light-emitting diode of claim 1 wherein the quantum dots of a surface-modified cadmium sulfide are present in a concentration of from about 3 to about 8 percent by weight.

18. A method for preparing the light-emitting diode of claim 1 comprising the steps of:
(A) modifying the surface of the cadmium sulfide by means of a thiophenol surfactant;
(B) copolymerizing a first fluorene monomer with a second fluorene monomer by means of Suzuki coupling; and
(C) processing a blending of the modified cadmium sulfide of step (A) and the product of step (B) by means of a π-π interaction through a physical doping.

19. The method of claim 18 wherein the first fluorene monomer is of the structure:

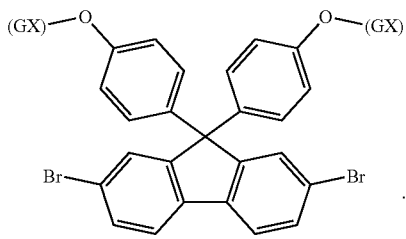

20. The method of claim 19 wherein the second fluorene monomer is of the structure:

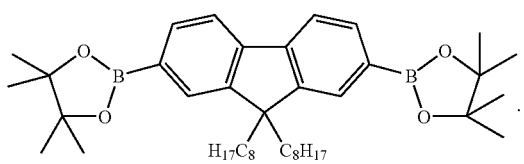

* * * * *